United States Patent [19]

Taddeo

[11] 4,410,064

[45] Oct. 18, 1983

[54] BASS RESPONSE SPEAKER HOUSING AND METHOD OF TUNING SAME

[76] Inventor: Anthony R. Taddeo, 800 Corwin Rd., Rochester, N.Y. 14610

[21] Appl. No.: 343,338

[22] Filed: Jan. 27, 1982

[51] Int. Cl.$^3$ .............................................. H05K 5/00

[52] U.S. Cl. .................................... 181/152; 181/156

[58] Field of Search ............... 181/152, 154, 155, 156, 181/159

[56] References Cited

U.S. PATENT DOCUMENTS 4,138,594 2/1979 Klipsch .......................... 181/152 X

*Primary Examiner*—Benjamin R. Fuller

*Attorney, Agent, or Firm*—Shlesinger, Fitzsimmons & Shlesinger

[57] ABSTRACT

The upper peak impedance of a speaker or woofer that is mounted in a base reflex or ported enclosure is dampened by designing the enclosure so that the speaker is mounted in the upper end of a horn formed in the housing, for example, by inclining its front wall to the vertical, so that its upper edge is located closer to the rear wall of the housing than its lower edge. The interior of the housing between the speaker and the housing port thus has a cross sectional area which increases progressively from the upper to the lower end of the housing, and thereby functions as an acoustical transformer, which dampens the cone of the speaker particularly in the area of its upper resonant frequency. Ideally the length of the horn is equal to approximately one quarter the wave length of the sound at the upper resonant frequency of the speaker, but if this is not practical the length can be equal to approximately one eighth the above-noted wave length, provided a fibrous entanglement is mounted in the horn to give the effect of a horn having a length one quarter of the above-noted wave length. The housing and speaker are tuned by adjusting the inclined front wall of the housing.

5 Claims, 2 Drawing Figures

BASS RESPONSE SPEAKER HOUSING AND METHOD OF TUNING SAME

BACKGROUND OF THE INVENTION

This invention relates to loudspeakers, and more particularly to an improved bass reflex type of speaker housing or enclosure, and a method of tuning the housing to its associated speaker.

When a speaker is energized, its cone reciprocates or vibrates at a frequency which varies with the signal input to the speaker coil. When an unmounted or unbaffled speaker is operated in a so-called "free air" mode, it exhibits a sudden increase in impedance as it approaches its resonant frequency. This impedance value peaks at resonant frequency and then abruptly falls off at higher frequencies. To dampen this peak and to provide a more uniform impedance response, it is customary to mount the speaker in some form of housing, so that the air in the housing will tend to dampen this peak impedance.

In its simplest form this housing may be a closed box with the speaker mounted or suspended in an opening in one wall thereof. This construction causes the amplitude of the peak impedance to be lowered, and to occur at a different frequency, thus changing the resonant frequency of the speaker as compared to its "free air" mode of operation.

Another type of speaker housing, and the one with which this invention is primarily concerned, is known as a bass reflex or ported enclosure. Typically this enclosure includes a hole or port in one of its walls, usually the wall or speaker panel upon which the speaker cone is mounted. The enclosure itself, as represented by the air therein, thus forms a resonator, and permits some of the air from within the enclosure to be driven or forced in and out of the port during vibration of the speaker cone. Air can thus be considered to vibrate like a piston in the port, sometimes vibrating at the same frequency as the speaker cone, and at other times being out of phase with the cone frequency. Ideally, however, the frequency of this air vibration is tuned to the resonant frequency of the speaker.

As is well known by those skilled in the art, the vibrating cone of a bass reflex mounted speaker has two resonant frequencies which are lower and higher, respectively, than the normal or "free air" resonant frequency of the speaker in its unmounted or freely suspended mode. For tuning purposes, only the upper resonant frequency need be tuned to the associated enclosure, because the lower resonant frequency is too low to be of any concern. (For reference, see *How To Design, Build & Test Complete Speaker Systems* by David B. Weems, 1st Ed., Tab Books of Blue Ridge Summit, Pa.)

Heretofore it has been customary to tune a speaker and its associated bass reflex enclosure either by varying the size of the port, or the overall size of the enclosure itself. One difficulty with these methods of tuning is that extreme care must be taken to employ the right size of housing and the correct port diameter, because any slight adjustment of one parameter usually requires a corresponding adjustment of the other.

SUMMARY OF THE INVENTION

An extremely efficient base reflex enclosure made according to this invention embodies a horn-shaped interior, which acts as an acoustical transformer for damping the peak impedance which occurs at the upper resonant frequency of a ported speaker housing. Typically the housing comprises a front baffle or wall having a speaker mounted in its upper end, and a ducted port formed in its lower end. This front wall of the housing is inclined to the vertical, so that its upper end is positioned closer to the back wall of the housing than its lower, ported end. The result is that the cross sectional area of the housing interior increases from a minimum adjacent the upper end of the housing to a maximum at its lower end. This expanding volume forms an internal horn, which, ideally, has a length approximately equal to $\frac{1}{4}$ of the wave length of the sound at the upper resonant frequency of the speaker.

Alternatively, the vertical height of the housing or horn can be less, for example approximately $\frac{1}{8}$ of the above-noted wave length, provided a fibrous entaglement is mounted in the housing to give the effect of a box or horn having a length of approximately $\frac{1}{4}$ of the above-noted wave length.

Still another novel feature of this invention is an improved method for tuning the box or enclosure resonance to that of the speaker, typically by adjustably tilting the forward or speaker bearing wall inwardly at its upper end during assembly until the desired horn configuration has been reached.

THE DRAWING

FIG. 1 is a typical impedance curve of a bass recess or ported enclosure of the type which is used for mounting a loud speaker in a housing made according to one embodiment of this invention; and FIG. 2 is a side elevational view of an improved speaker housing made according to one embodiment of this invention, portions of the housing being broken away and shown in section for purposes of illustration.

DETAILED DESCRIPTION OF THE PREFERRED EMBODIMENTS

Figure 1:
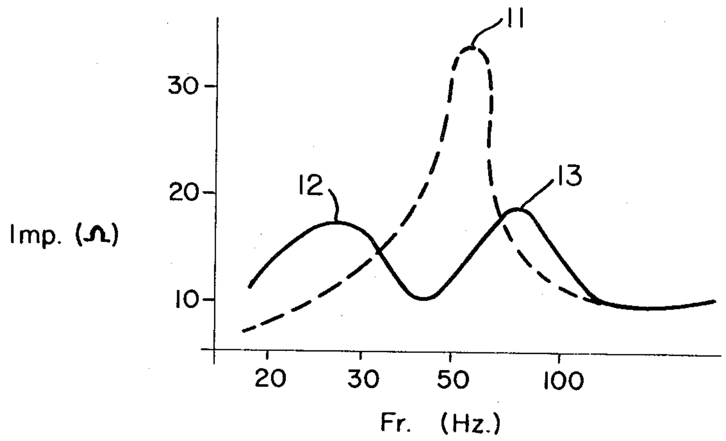

Referring first to FIG. 1, the curve shown in broken lines represents a typical impedance curve for an unmounted or unbaffled speaker which is allowed to vibrate or operate in free air. The numeral 11 denotes the peak impedance, which occurs at the resonant frequency of the speaker. The curve shown by a solid line is representative of the impedance of a similar speaker which has been mounted in a bass reflex or ported enclosure.

As noted above, the mounting of the speaker in a ported enclosure has the effect of causing its resonant frequency, which normally exists in free air, to be replaced by lower and higher resonant frequencies and corresponding lower and higher impedance peaks denoted at 12 and 13, respectively, in FIG. 1. In addition it will be noted that the amplititudes of the impedance at the low and high frequency peaks 12 and 13 are substantially reduced as compared to the amplitude of the peak impedance (11) which exists when the speaker is operating in "free air". As previously mentioned, the lower peak 12 occurs at a frequency which is below the necessary bandwidth or frequencies which are of any concern for this type of speaker. The upper peak impedance 13, however, occurs in a range of approximately 75 Hertz, and it is therefore desirable to reduce this peak impedance to improve operation of the speaker.

Figure 2:
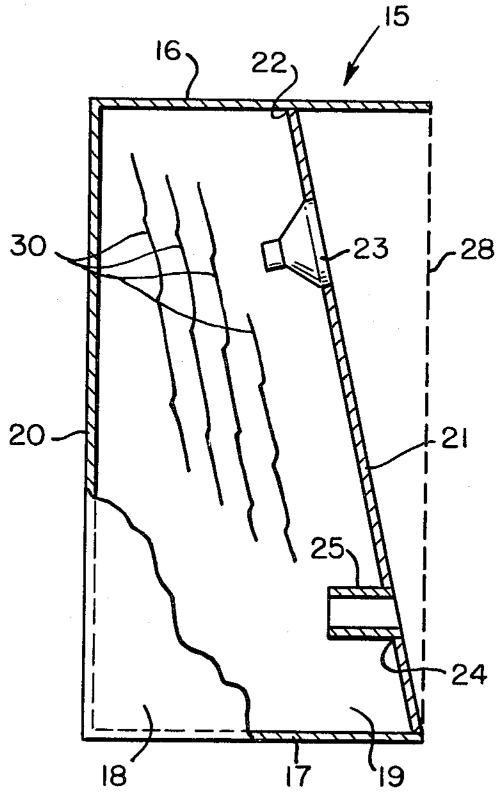

In accordance with the present invention, this reduction of the upper, peak impedance 13 is effected by utilizing a housing of the type which is denoted generally at 15 in FIG. 2. This housing comprises parallel top and bottom walls 16 and 17 that are secured in spaced relation by a pair of spaced, parallel side walls 18 and 19, and a rear wall 20, which lies in a plane that is disposed at right angles to walls 16 through 19. The enclosure is completed by an inclined front wall 21, which is secured between the side walls 18 and 19 to extend upwardly from adjacent the forward edge of the lower wall 17 in a plane inclined to the vertical, and so that its upper edge 22 intersects the inside surface of the upper wall 16 along a line spaced inwardly from the right hand or forward edge of wall 16 as shown in FIG. 2.

Mounted in a conventional manner is an opening in the upper end of wall 21 substantially medially of its side edges is a conventional woofer or loudspeaker 23. Secured at one end in a port or opening 24, which is formed in the wall 21 adjacent its lower edge, and projecting inwardly into the housing interior, is a tubular duct 25. For aesthetic purposes, among others, a felt or fabric layer 28 is secured over the right hand end of the housing 15 as shown in FIG. 2, thereby to cover the outer face of the inclined wall 21.

The essence of this construction is that the interior of housing 15, excluding the portion thereof that is located at the exterior of baffle 21 beneath the upper wall 16, is shaped in the form of a horn, the cross sectional area of which increases progressively from the upper wall 16 to the lower wall 17 of the housing. The drive or cone of speaker 23 is located adjacent the upper end of this horn, while the duct 25 is located adjacent its lower end. In this manner the horn-shaped interior dampens the cone speaker 23 by adding to the output of the port or duct 25, thus in effect damping the speaker's upper impedance peak—i.e., the peak similar to that denoted at 13 in FIG. 1.

In practice, the overall dimensions of housing 15 cna first be selected to suit the particular woofer or speaker that is to be employed, or vice versa. Thereafter the desired port 24 is selected by using, for example, the Thiele alignments, a known design system referred to in publications such as the 1971 issue of the *Journal of Audio Engineering Society.* After mounting the speaker in the housing its upper impedance peak (13) is determined by electrically checking the impedance of the speaker driver. Thereafter the front wall 21 of the housing is adjusted so that it becomes inclined to the vertical, and creates within the housing the horn-shaped interior, which in effect is an acoustic transformer between the speaker 23 and the duct 25. For proper performance it is essential that the overall height or length of the horn-shaped interior of housing 15 be equal to approximately ¼ the wave length of the sound at the upper frequency peak of the associated speaker, as represented for example by peak 13 in FIG. 1.

In those cases where it may be impractical to design the horn length to equal approximately ¼ the wave length of the sound at the upper resonant frequency, a shorter horn or housing 15 can be employed, for example one equal to ⅛ the above-noted wave length. The effective length of this shorter horn can be increased to the ¼ wave length parameter by adding to the interior of the housing a fibrous entanglement, such as wool fibers or batting materials which are mounted in the horn section as denoted at 30 in FIG. 2.

While applicant is not the first to employ an inclined speaker panel on a bass reflex or ported enclosure (see, e.g. FIGS. 7–19 on pg. 196 of the above-noted publication of David B. Weems), applicant is the first to recognize the unexpected improvement which is achieved by inclining this speaker panel to form in the housing a horn having an effective length of approximately ¼ the wave length of the speaker output at its upper resonant frequency. Likewise novel is applicant's method of tuning the enclosure to the speaker by proper adjustment of the inclined speaker panel, and the use of a fibrous entanglement for effectively lengthening the horn in the housing.

From the foregoing it will be apparent that applicant has developed a relatively simple and inexpensive means for considerably increasing the efficiency of bass reflex enclosures. Instead of utilizing the enclosure as a simple rectangular box, applicant has modified the enclosure to form therein a horn, which functions as an acoustic transformer to dampen the upper frequency or impedance peak of a conventional speaker. This is done by determining the upper impedance peak frequency and then designing the enclosure so that the horn therein will have a length approximately equal to ¼ the wave length of the speaker output at its upper resonant frequency. If this is unsatisfactory the housing can be designed to have a horn-shaped interior the length of which can be approximately one eighth the above-noted wave length, but in such case a fibrous entanglement should be mounted in the housing to provide the effect of a horn having a length equal to one quarter of the wave length of the sound at the upper resonant frequency of the speaker. As for the cross sectional area of the horn, the larger end may be in the range of from 1.5 to 3.0 times the cross sectional area of the smaller end, and preferably in the range of from 2.0 to 2.5.

Moreover, simply by adjusting the angle and disposition of the inclined forward housing wall 21, it is possible accurately to tune the frequency of the housing resonance to the upper resonant frequency of the associated speaker. Also, it will be apparent that more than a single port may be employed in the speaker, if desired (e.g. twin ports), or a passive radiator may be employed in port 24 rather than a tubular duct.

While this invention has been illustrated and described in connection with only one embodiment thereof, it will be apparent that it is capable of still further modification, and that this application is intended to cover any such modifications as may fall within the scope of one skilled in the art or the appended claims.

What I claim is:

1. A method of acoustically reducing the upper peak impedance of a loudspeaker of the type mounted in a ported housing, comprising
   determining the upper resonant frequency of a speaker mounted in a ported housing with its mouth facing outwardly, and adjusting at least one wall of the housing relative to another to form in the housing a horn which has a cross sectional area that progressively increases at least from a point adjacent the rear of the speaker to a point adjacent the port in said housing, and which has a length approximately equal to ¼ the wave length of the sound produced by the speaker at its upper resonant frequency.

2. A loudspeaker, comprising
   a housing having a speaker mounted in the wall thereof adjacent one end of the housing, with the mouth of the speaker facing outwardly, and said housing having a port formed in said wall adjacent the opposite end of the housing, and means defining a horn in said housing between the rear of said speaker and said port, said horn having its larger end adjacent said port and its smaller end adjacent said speaker, and said horn having an effective length approximately equal to one quarter the wave length of the output of said speaker at its upper resonant frequency.

3. A loudspeaker as defined in claim 2, wherein said housing comprises a plurality of plane, intersecting walls one of which is inclined to another to form said horn in the housing.

4. A loudspeaker as defined in claim 2, wherein the linear length of said horn is equal approximately to $\frac{1}{4}$ said wave length.

5. A loudspeaker as defined in claim 2, wherein the linear length of said horn in approximately $\frac{1}{8}$ said wave length, and a fibrous entanglement is mounted in said horn between said speaker and said port.

* * * * *